United States Patent [19]
Andersson

[11] Patent Number: 5,805,429
[45] Date of Patent: Sep. 8, 1998

[54] RAIL ASSEMBLY

[75] Inventor: Leif Erik Andersson, Nynäshamn, Sweden

[73] Assignee: Telefonaktiebolaget LM Ericsson, Stockholm, Sweden

[21] Appl. No.: 737,479

[22] PCT Filed: Jun. 2, 1995

[86] PCT No.: PCT/SE95/00641

§ 371 Date: Nov. 13, 1996

§ 102(e) Date: Nov. 13, 1996

[87] PCT Pub. No.: WO95/35018

PCT Pub. Date: Dec. 21, 1995

[30] Foreign Application Priority Data

Jun. 10, 1994 [SE] Sweden .................................. 9402018

[51] Int. Cl.$^6$ ....................................................... H05K 7/14
[52] U.S. Cl. .......................... 361/799; 361/753; 361/756; 361/796; 361/800; 361/802; 361/816; 439/377; 174/35 R
[58] Field of Search ..................................... 361/724–728, 361/736, 740, 741, 747, 748, 752, 753, 756, 759, 784, 796–803, 825, 829, 816, 818; 439/345, 377, 325, 61, 64, 95–96, 108; 312/223.1; 174/35 R, 51; 403/331

[56] References Cited

U.S. PATENT DOCUMENTS

| | | | |
|---|---|---|---|
| 3,760,233 | 9/1973 | Warwick | 361/802 |
| 5,187,648 | 2/1993 | Ito | 361/799 |
| 5,467,254 | 11/1995 | Brusati et al. | 361/799 |

FOREIGN PATENT DOCUMENTS

| | | |
|---|---|---|
| 2537106 | 5/1986 | Germany. |
| 2622598 | 5/1986 | Germany. |
| 3539404 | 12/1987 | Germany. |
| 4221846 | 1/1993 | Germany. |
| WO92/16093 | 9/1992 | WIPO. |

*Primary Examiner*—Leo P. Picard
*Assistant Examiner*—Phuong T. Vu
*Attorney, Agent, or Firm*—Burns, Doane, Swecker & Mathis, L.L.P.

[57] ABSTRACT

The invention relates to a rail assembly adapted for an earth potential related magazine (1) which is constructed to accommodate a plurality of printed circuit boards, circuit boards having circuit components mounted thereon, or printed boards. An electrical contact rail (3b) has a U-shaped cross section wherein a first leg (41) is provided with a row of tongues whose outer parts are bent towards the second leg such as to form a row of electrical contact points (41c) which are intended for electrical coaction with an earth potential related layer on the circuit board, and wherein the bottom rail part (43) extending between the legs is provided with a plurality of mutually sequential contact tongues whose outer parts form a row or electrical contact points which are intended to lie against electrical contact surfaces (1b) belonging to and assigned to the magazine at a chosen contact pressure when the rail assembly is fitted, so as to obtain an earth potential relationship.

20 Claims, 2 Drawing Sheets

RAIL ASSEMBLY

TECHNICAL FIELD

The present invention relates to a rail assembly, and then more particularly, but not exclusively, to a rail assembly intended for insertion into an earth potential related or connected magazine.

Earth potential related magazines of the kind intended here are used in telecommunications systems and in telecommunications equipment and are constructed to accommodate a plurality of boards, such as boards which carry printed circuits, referred to as printed circuit boards, circuit boards, ie loaded printed circuit boards, and pattern boards, referred to as printed boards, these different types of boards being referred to in the following as circuit boards.

Earlier rail assemblies that can be used in such earth potential related magazines are adapted to coact over discrete electrical contact points with an earth potential related layer on the circuit board which serves as a surface layer, and also with a magazine earth plane, and also include requisite electrical discrete contacts for the transmission of information-carrying signals.

The mutually parallel rails of such rail assemblies are intended to coact with mutually opposing edge-parts of a circuit board and are each provided with mutually opposing grooves or channels whose widths allow the circuit board to be moved along the grooves to a magazine-inserted position and a magazine-withdrawn position, or vice versa.

The inventive rail assembly is intended to enable an effective connection to be established between the earth potential related layer on a circuit board and the earth plane of the magazine with extremely short transmission paths.

More particularly, the present invention relates to a rail assembly adapted for use in an earth potential related magazine and adapted to connect electrically an electrically conductive contact rail in the rail assembly directly to a magazine earth plane via a row of contact points, so as thereby to provide conditions which enable electromagnetic disturbance fields generated by occurrent information-carrying current pulses and voltage pulses to be screened or shielded through the medium of outer earth potential related layers on the circuit board.

The present invention relates particularly to an application in the field of earth-related circuit board magazines in which external conductors and/or lines are brought into coaction with circuit board related circuits, conductors, lines and the like through the medium of electrical connecting devices.

Magazines of the kind intended here are adapted to within electronic circuits handle information-carrying signals whose current pulses and/or voltage pulses can have a frequency or bit rate within the Gb/s range.

Electronic systems of this kind are encumbered with the drawbacks that high frequency electromagnetic signals leak out as radio waves while, at the same time, the circuits become sensitive to such electromagnetic disturbance fields and therewith lose the ability to transmit the information-carrying signals correctly.

An object of the invention is to provide a system in which all disturbing signal paths are carefully screened and earth potential related.

The inventive arrangement is also intended to overcome problems related to EMC type (Electro Magnetic Compatibility) and also in certain cases disturbance fields of the EMD type (Electro Magnetic Discharges).

DESCRIPTION OF THE PRIOR ART

There are known to the art several different kinds of rail assemblies of the aforedefined kind adapted for earth potential related magazines.

These known rail assemblies are primarily intended to guide the top and bottom edge regions of a circuit board into the magazine correctly, so that electrical discrete contact surfaces on the inwardly facing edge of the circuit board will lie in contact with corresponding electric contact surfaces on an electrical contact strip which is mounted on the magazine, normally on the magazine backplane, and which has provided thereon discrete electrical contact surfaces that are adapted to coact with corresponding electrical contact surfaces on the circuit board.

In this case, earthing of the circuit board is achieved in connection with the contact strips, by giving the electrical contact surfaces of some contact strips an earth potential relation and allowing said electrical contact surfaces to coact with an earth potential related layer or layers on the circuit board.

A number of previously known rail assemblies of the above described kind belongs to the related art.

The following patent publications can be mentioned as examples.

DE-A1-4 221 846.

It is, through this publication, previously known a contact rail, fitted to an insulating base, intended for a ground related coaction with a magazine and a circuit board.

Said contact rail can be regarded as having a U-shaped form with contact tongues (7, 7a) that are positioned in two parallel rail related rows, adapted to a coaction with a short printed conductor and a row of further contact points (9a) that are meant to rest towards the magazine.

The contact tongues (7, 7a) are oriented in the longitudinal direction of the rail.

DE-C2-2 622 598

It is here described a mounting rail with a number of spring-fingers (44, 46) and between oriented thicker sections (40).

In the edge area there is an opening (32), with a width "c" which is selected to be somewhat larger than the distance "a" between the spring-fingers (44, 46) and somewhat smaller than the distance "b" between the sections (40). The purpose of this construction is to reduce any vibrations that might influence the circuit board.

DE-C2-3 539 404 and DE-C2-2 537 106.

These two publications also describes rails intended to guide a circuit board in a magazine, with a construction that provides two opposite parallel rail related rows of contact tongues oriented in the longitudinal direction of the rails.

DISCLOSURE OF THE INVENTION

Technical Problems

When considering the present standpoint of techniques, as described in the above cited publications, it will be seen that a technical problem resides in effectively screening each circuit board -hat is inserted in a magazine, by relating the earth potential related layer of the circuit board with the earth potential related earth plane of the magazine, even when the electronic system utilizes signals of very high frequencies, and also in providing conditions for achieving a good screening effect even with respect to higher frequencies that can be expected in the future.

It will also be seen that another technical problem is one of creating conditions which will enable high frequency current pulses and voltage pulses occurring within and adjacent magazine-inserted circuit boards to be screened and earth potential related, and to provide conditions for extinguishing those current pulses and voltage pulses which would otherwise generate disturbance fields in the form of radio waves, so that these pulses will not have a disturbing effect on other equipment, and on the local equipment.

It will also be seen that a technical problem is one of realizing the significance of using a rail assembly which includes a mounting base made of an electrically insulating material, and an electrically conductive contact rail which is held firmly by the mounting base, wherein both mounting base and electrical contact rail can be readily produced in separate parts and brought into coaction with one another in a simple manner.

It will also be seen that a technical problem resides in realizing the significance of allowing such a contact rail to have a U-shaped cross-section and to provide one leg of the rail with a row of contact-tongues whose outer parts are bent with an angle towards the other leg of the rail, such as to form a plurality of row orientated electrical contact points intended for electrical coaction with the earth potential related layer or layers on the circuit board, and to, in a previously known way, provide the bottom part of the rail extending between the legs with a plurality of mutually sequential contact tongues whose outer parts form a row of contact points which are adapted to lie against earth potential related contact surfaces belonging to the magazine and assigned thereto) at a chosen contact pressure when inserting the rail assembly into the magazine.

It will also be seen that a technical problem resides in the provision of conditions and dimensions such that the electrical contact points will be positioned so as to lie against individual, discrete electrical contact surfaces that are formed between holes or apertures provided in a part, such as an upper or a lower part, of the magazine for air-ventilating purposes.

It will also be seer that a technical problem is one of realizing the significance of providing the mounting base with electrically insulating pins or projections which are adapted for passage through said bottom part and which are also adapted for passage through selected air-ventilating holes, so as to obtain locking coaction with one part of the magazine and/or a supplementary mounting socket part.

In addition, it will be seen that a technical problem resides in realizing that a requisite earth potential relationship is dependent on a chosen number of electrical contact points on a contact rail, and that the electrical contact points on said rail located between pin-receiving apertures should be from between three and eight in number, normally about five in number.

It will also be seen that a technical problem is one of realizing the significance of dimensioning the contact tongues in relation to the width of the bottom part of said rail, and therewith to realize in particular that these contact tongues should have a width corresponding to between 25% and 50% of the width of said bottom rail-part.

It will also be seen that a technical problem resides in realizing the significance of giving the electrical contact rail a stiffness which is suitable for the purpose intended and of ensuring that the contact rail will be appropriately dimensioned in this regard when the rail is produced from a metal material having a thickness in the region of 0.1 mm.

It will also be seen that in this regard, a technical problem resides in realizing that when a rail is made of such material, each contact-tongue shall have a width of 4–10 mm and that the distance between adjacent tongues shall be small per se but can be chosen to be 1–4 mm in the case of this application.

It will be seen that another technical problem resides in the ability to select the height of respective tongue in said material, and to realize that this height should lie within the range of 5–10 mm.

In order to provide good spring properties with regard to the described application, it will be seen that a technical problem resides in realizing those advantages that are afforded by providing a recess or a slot between mutually adjacent tongues, said slot or recess being extended slightly into the bottom part of the rail.

Another technical problem will be seen to reside in realizing the significance of angling the uppermost part of the said other leg from said one leg.

In addition, it will be seen to be suitable to give one leg a longer length than the other leg, and to position the electrical contact points on the rail at a distance above the said other leg, this distance being from 1–3 mm.

It will also be seen that a technical problem resides in realizing the advantages that are obtained in a case where the contact points, belonging to contact-tongues of one leg, are formed by means of a simple angular bending, of a material portion at the uppermost part of the leg, towards the other leg.

In addition, it will be seen that a technical problem resides in realizing the advantages that are obtained by forming the contact-tongues, belonging to one leg, through side related slots in the leg, having the slots oriented perpendicular to a selected sliding direction of the circuit board along the rail.

Solution

With the intention of providing a solution to one or more of the aforesaid technical problems, there is proposed in accordance with the present invention a rail assembly which is adapted for use in an earth potential related magazine, wherein the magazine is constructed to accommodate a plurality of circuit boards, these boards being of the kind defined above.

The aforesaid rail assembly is constructed to coact via discrete electrical contact points with an earth potential related layer proved on the circuit board and serving as a surface layer, and with a magazine-mounted earth plane, wherein respective circuit boards are intended to coact with mutually parallel rail assemblies which coact with mutually opposed edge-parts of the circuit board and which are each provided with mutually opposing grooves or channels whose widths are adapted to enable the circuit board to be moved along the rail grooves to a position in which the circuit board is located in the magazine and a position in which the circuit board is located outside the magazine, or vice versa.

In the case of an earth potential related magazine of this kind, it is proposed in accordance with the invention that the rail assembly is comprised of a mounting base made of an electrically insulating material, and an electrically conductive contact rail which is held firmly but loosely in the mounting base.

Besides this, the contact rail shall have a U-shaped cross-section with one rail leg provided with a row of tongues whose outer parts are bent towards the other rail leg such as to form a row of electrical contact points in order to enable electrical coaction with the earth potential related layer on said circuit board, and that the bottom part of the rail extending between said legs is provided with a plurality of mutually sequential electrical contact tongues whose outer parts form a row of electrical contact points which are intended to lie with a selected contact pressure against electrical contact surfaces belonging and assigned to the magazine when the rail is inserted in the magazine, therewith to obtain an earth potential relationship.

From the standpoint of such a rail assembly, as shown and described in the publication DE-A1-4 221 846, the present invention proposes that the contact point belonging to the contact-tongues of at least one leg are formed by means of a simple angular bending, of a material portion at the uppermost part of the leg, towards the other leg and that said contact-tongues are formed through side related slots or recesses oriented perpendicular to a selected sliding direction of the circuit board.

According to proposed embodiments which lie within the scope of the inventive concept, it is proposed that the electrical contact points, belonging to the aforesaid bottom part, are positioned and adapted for abutment with individual discrete electrical contact surfaces formed between holes provided in one part of the magazine.

It is also proposed that the mounting base is provided with electrically insulating pins or projections, and that these pins or projections are adapted for passage through said bottom part for locking coaction with a part of the magazine and/or a supplementary mounting base part.

It is also proposed that the electrical contact points on the contact rail between apertures or recesses intended to receive insulating pins are between three and eight in number, normally about five in number.

According to one embodiment of the invention, the electrical contact tongues have a width which corresponds to between 25% and 50% of the width of the bottom part of the rail.

When the electrical contact rail is made of a metal material, such as a brass material, having a thickness of about 0.1 mm, it is proposed that each tongue shall have a width of 4–10 mm, and that the distance between mutually adjacent tongues is 1–4 mm, and that each tongue has a height of 5–10 mm.

It is also proposed that a recess or slot located between mutually adjacent tongues extends slightly into the bottom part of the rail.

Said other leg is flat and its uppermost part is angled from said one leg.

The one leg is longer than the other leg and the electrical contact points on the one leg are positioned at a distance above the other leg.

In this regard, the distance may be from 1–3 mm.

Advantages

Those advantages that are primarily afforded by an inventive rail assembly reside in the ability to connect an exposed edge-orientated earth potential related layer on a circuit board to an earth potential related magazine. Electromagnetic fields that occur within the circuit board are effectively screened, and therewith prevented from influencing the circuits and conductors of adjacent circuit boards, by providing a plurality of discrete electrical contact points with the earth potential related layer along the whole of the edge-part of the board and with short electrical transmission paths over closely adjacent electrical contact points with the magazine and connecting the earth potential related layer to the magazine earth plane, and by placing such rails along at least two, preferably three sides of the printed circuit board.

Further, a simple structure to form the discrete contact points are provided.

The main characteristic features of a rail assembly adapted to an earth potential related magazine are set forth in the characterizing clause of the following claim 1.

BRIEF DESCRIPTION OF THE DRAWINGS

A rail assembly adapted for use in an earth potential related magazine will now be described in more detail with reference to an embodiment thereof at present preferred and also with reference to the accompanying drawings, in which.

DESCRIPTION OF EMBODIMENTS AT PRESENT PREFERRED

Figure 1:
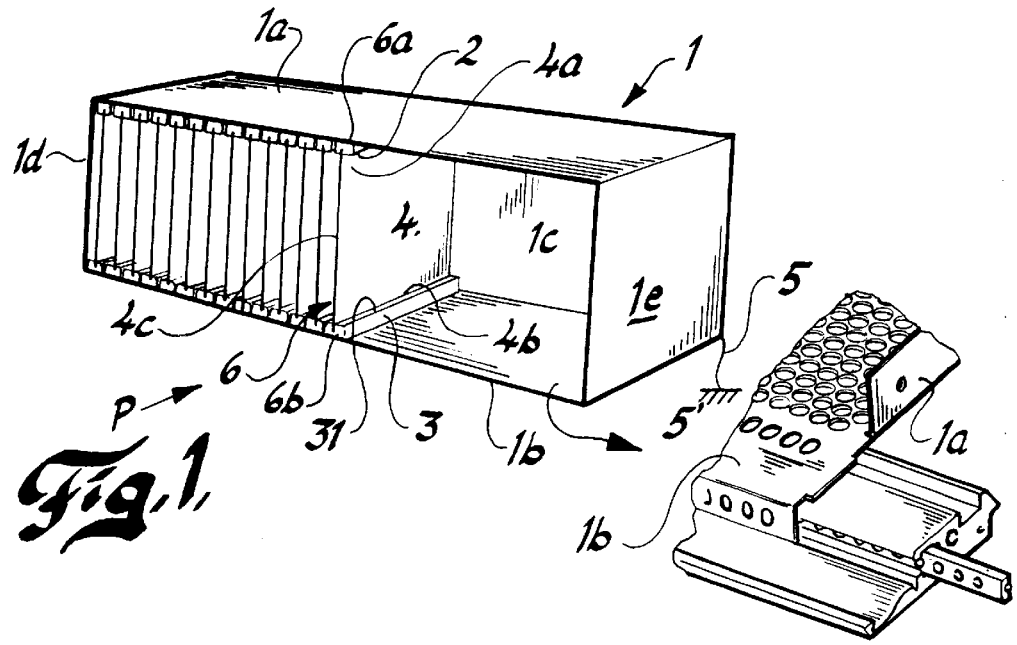
FIG. 1 is a perspective view of an earth potential related magazine having inserted therein a number of schematically shown circuit boards, said Figure also including an enlarged view showing the configuration of a bottom plane.

FIG. 1 illustrates in perspective a magazine in which there is inserted a number of printed circuit boards, circuit boards or printed boards as hereinbefore defined, said circuit boards being shown schematically in the Figure.

Although FIG. 1 illustrates a magazine 1 having an upper plane 1a and a bottom plane 1b and a back plane 1c, and an electrical connecting arrangement 2 in the upper plane 1a and an electrical connecting arrangement 3 in the lower plane 1b, it will be understood that this or a similar connecting arrangement can equally as well be assigned to the back plane.

The illustrated embodiment is based on the requisite electrical contact connection with the circuit board 4 being achieved via the edge-part 4c, and also on the assumption that the illustrated inventive rail assembly can be caused to coact with an upper plane 1a through the medium of a first rail assembly 2, or with a lower plane 1b through the medium of a second rail assembly 3.

A corresponding rail assembly could well be fitted to the back plane 1c and adapted for coaction with the inwardly facing edge-part of the circuit board 4.

Figure 3:
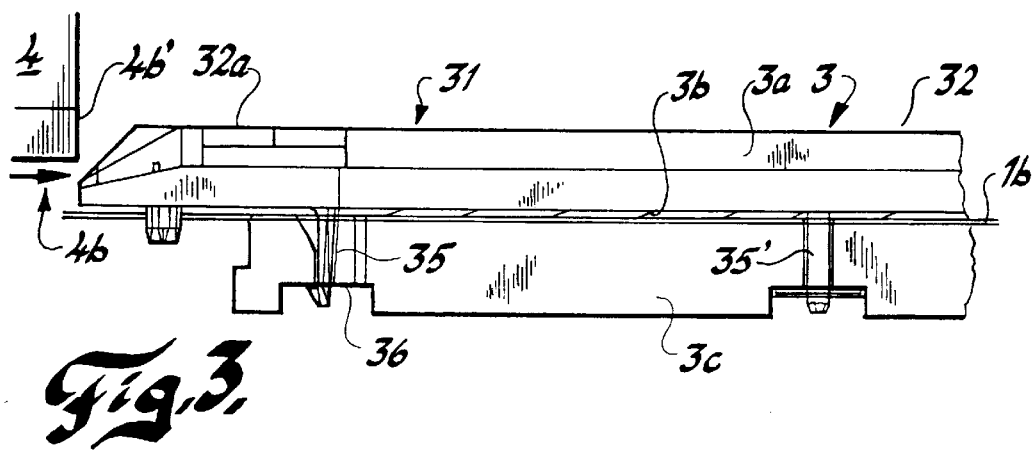
FIG. 3 is a side view of a rail assembly fitted to said bottom plane.
Figure 4:
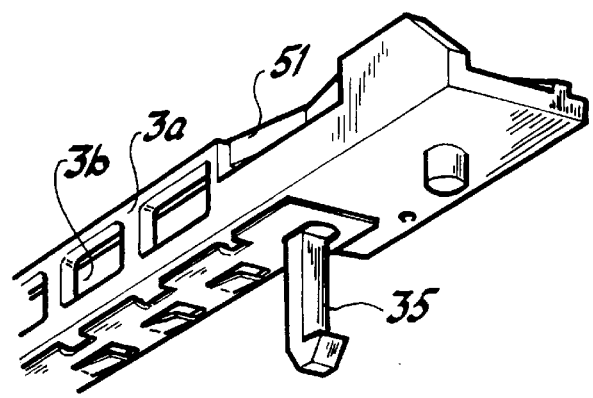
FIG. 4 is a first perspective view of one end-part of a rail assembly.
Figure 5:
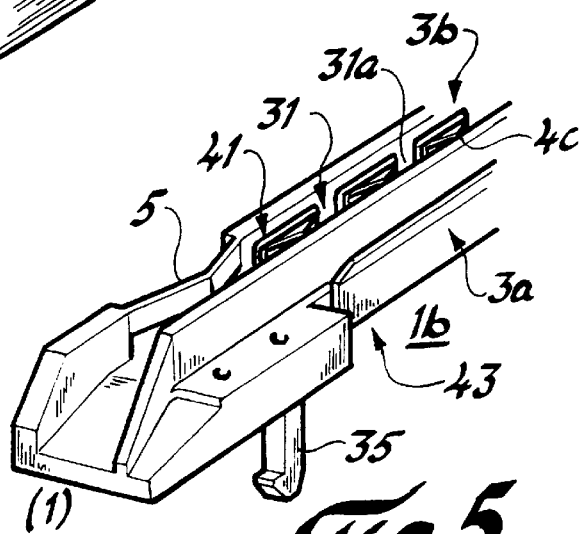
FIG. 5 is a second perspective view of the end-part shown in FIG. 4.

The rail assembly, such as the rail assembly 3, is comprised of three coordinated parts or elements, i.e. an electrically insulating strip-shaped mounting socket 3a, an electrically conductive strip-shaped contact rail 3b and a supplementary electrically insulating part 3c, as illustrated in FIG. 3.

The electrical connection arrangements or rail assemblies 2 and 3 are each intended to mechanically and electrically connect a respective one of a row of electrical contact surfaces provided along an edge-part 4a and/or an edge-part 4b, such as a bottom edge-part 4b, of a circuit board 4, the nature of said contact surfaces being described in more detail below.

It should be noted that the bottom edge-part 4b of the circuit board 4 is intended to bring an earth potential related layer or layers 4b' on the circuit board into electrical and mechanical connection with a magazine earth plane via a direct connection through the medium of the rail 3b and with the aid of a plurality of electrical contact means.

The circuit board 4 is identical to remaining boards and it is assumed that the board 4 can be easily inserted to the position shown in FIG. 1, the direction of board movement being shown by an arrow P in the illustrated case.

As will become apparent from the following description made with reference to other Figures, an essential feature of the present invention is that the earth potential related magazine 1 and its frame or chassis is in electrical contact with an earth potential reference 5' through the medium of a conductor 5. The magazine planes 1a, 1b, 1c, 1d and 1e are made of metal sheet.

The magazine 1 is constructed to accommodate a plurality of circuit boards in side-by-side relationship, each of said boards being referenced 4.

Each circuit board, such as the circuit board 4, is provided along one of its sides 4c with a metallic rail (not shown in FIG. 1), wherein the rail is earth potentially related through the medium of upper 6a or lower 5b electrical contact surfaces and through the medium of the magazine casing or frame.

Requisite connection to external cabling is effected with the aid of electric connectors related to the rail.

Figure 2:
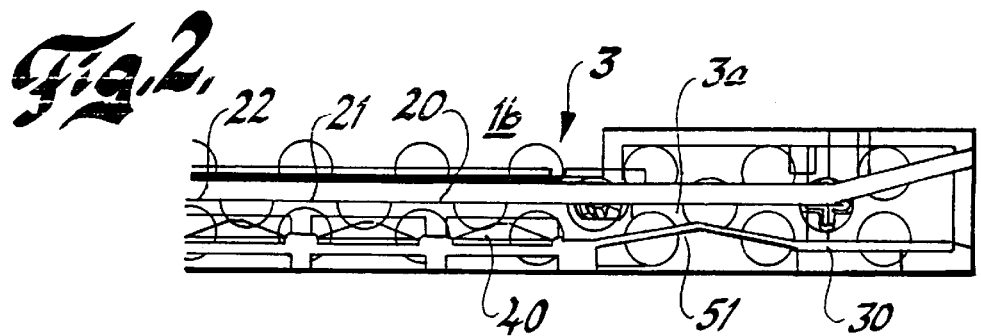
FIG. 2 shows from above part of the bottom plane with a rail assembly mounted thereon.

FIG. 2 is intended to illustrate such a rail assembly 3 fixedly related to a bottom plane 1b and intended to connect one earth plane of the circuit board 4 to earth potential.

A rail assembly 2 is fixedly related to an upper plane 1a and is intended to connect another earth plane of the circuit board 4 to earth potential in principly the same manner as with the rail assembly 3.

The rail assembly 3 is intended to be mounted adjacent other rail assemblies and may be positioned parallel with the bottom plane 1b (or the upper plane 1a).

It should be mentioned that the plane 1a and the plane 1b are both comprised of perforated metal plates, where with regard to distribution and size the holes or perforations are structured so that electromagnetic fields will not leak out or in, and to ensure sufficient air-ventilation for cooling purposes. In this regard, it is necessary for the holes to be placed close together and given only a small diameter, such as to define only narrow hole-bridging intermediate metal parts.

Each of the rail assemblies 2, 3 is provided with an individual groove or channel 31, said grooves facing towards one another, wherein the width of said grooves is adapted to enable the circuit board 4 to be moved along the grooves in said rails to a magazine 1 inserted position and to a magazine 1 withdrawn position, or vice versa.

The mounting base 3a includes an elongated centre part 32 which is terminated by end-related parts 32a.

Figure 6:
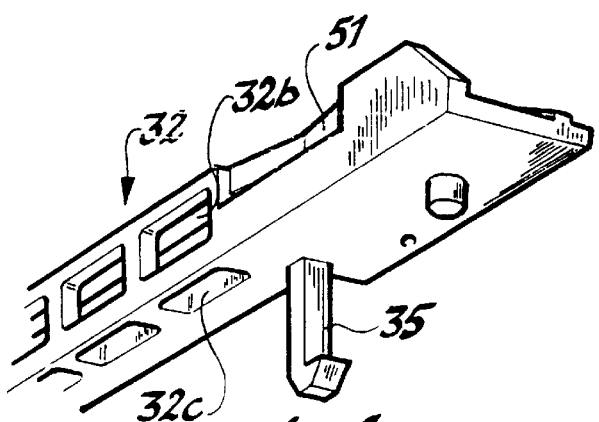
FIG. 6 is a first perspective view of an electrically insulated mounting base part.
Figure 7:
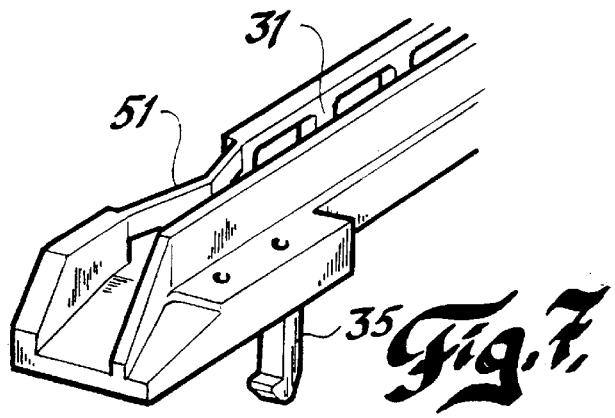
FIG. 7 is a second perspective view of the mounting base part shown in FIG. 6.

The centre part 32 is provided with a number of apertures 32b (see FIGS. 6 and 7) formed in the one leg while apertures 32c are formed in the bottom rail-part.

Figure 8:
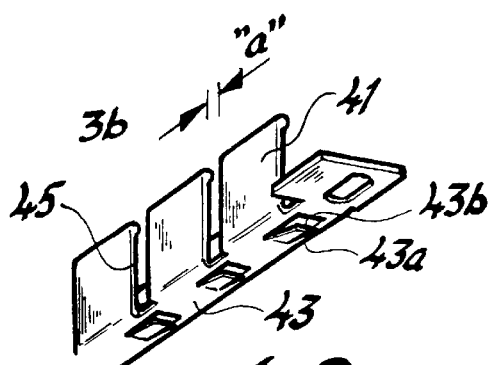
FIG. 8 is a first perspective view of an end-part of an electrically conductive contract strip.
Figure 9:
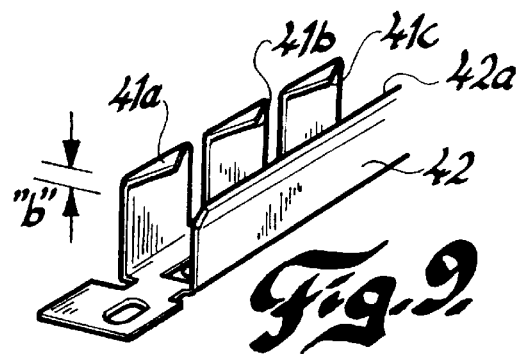
FIG. 9 is a second perspective view of the end-part shown in FIG. 8.

As will be seen from FIGS. 8 and 9, the electrical contact rail 3b has a U-shaped cross-section, where one leg 41 has formed therein a row- of mutually spaced tongues 41a whose outer parts 41b are bent in towards the other leg 42, so as to form a row of electrical contact points 41c.

These electrical contact points 41c are intended to coact electrically with an earth potential related and exposed layer 4b' on the circuit board 4.

The bottom part 43 that extends between the legs is provided with a plurality of mutually sequential electrical contact tongues 43a whose outer parts 43b form a row of electrical contact points which when the rail 3 is fitted in accordance with FIG. 3 are intended to abut electrical contact surf aces belonging to and assigned to the magazine 1 at selected contact pressures, so as to obtain an earth potential relationship, said magazine related contact surfaces being provided in the plane 1b.

In the FIG. 2 illustration, these contact surfaces have been referenced 20, 21, 22 and each is thus positioned between four holes.

The electrical contact points 43b are positioned and adapted to abut the aforesaid individual, discrete contact surfaces 20-22 formed between holes in a part of the magazine with a pressure which is determined by the form of the pats 3a, 3b and 3c.

The mounting base 3a is provided with electrically insulating pins 35 which are adapted for passage through holes provided in the bottom part 43, for locking coaction with a part 36 of the magazine and/or a supplementary mounting base part 3c.

The contact-associated contact points between apertures intended to receive said insulated pins 35, 35' are between three and eight in number, normally about five.

The aforesaid electrical contact tongues have a width which corresponds to between 25% and 50%, preferably to about 30% to 40% of the width of the bottom part 43.

The aforesaid contact rail 3b is made from a metal material, such as a brass material, having a thickness of about 0.1 mm.

Each tongue 41 has a width of 4–10 mm, preferably 5–6 mm and the distance "a" between mutually adjacent tongues is from 1–4 mm, normally 2–3 mm, and each tongue 41 has a height of 5–10 mm, normally 6–7 mm.

An aperture or slot 45 located between mutually adjacent tongues and forming said distance "a" is adapted to extend slightly into the bottom part 43 and is, besides this, oriented in a direction which is perpendicular to the longitudinal direction of the rail.

The top part 42a of the second leg 42 is angled from the first leg 41 and the first leg is longer than the second leg, and the electrical contact point 41c belonging to the leg 41 are located at a distance "b" above the second leg 42.

According to the invention, the distance "b" is from 1–3 mm, preferably about 2 mm.

A plastic spring 51 is formed in the part 3a adjacent the groove 31 and functions to urge the board 4 against the edge 31a and away from the electrical contact points 41c as the board is inserted and withdrawn, in order to bring connections belonging to the board in coaction with connections belonging to the magazine.

It will be understood that the invention is not restricted to the aforedescribed and illustrated exemplifying embodiments thereof and that modifications can be made within the scope of the inventive concept as defined in the following claims.

I claim:

1. A rail assembly adapted for an earth potential related magazine which is constructed to accommodate a plurality of printed circuit boards, circuit boards having circuit components mounted thereon, and printed pattern boards or circuit cards, the rail assembly being intended for coaction with an earth potential related layer belonging to the circuit board and serving as an outer layer, and also to coact with an earth plane belonging to the magazine, wherein respective circuit boards are intended to coact with mutually parallel rails which are able to coact with the opposing edge-parts of the circuit board, wherein the rails have mutually opposing grooves or channels whose widths are adapted to enable the circuit board to be moved along the rail grooves to a magazine inserted position and to a magazine withdrawn position, or vice versa, the rail assembly comprising a mounting base made of an electrically insulating material, and an electrically conductive contact rail which is held by the mounting base, the contact rail having a U-shaped cross-section formed by a first and a second rail leg and a bottom part of the rail extending between the first and the second rail leg, at least one of the first and the second rail legs being provided with a row of tongues, each tongue of the row of tongues having an outer part forming an electrical tongue contact point, and the bottom part of the rail having a plurality of mutually sequential electrical contact tongues, each contact tongue of the plurality of contact tongues having an outer part forming a contact tongue contact point such that the plurality of contact tongues have a plurality of contact tongue contact points, the contact tongue contact points being adapted to abut electrical contact surfaces belonging to and assigned to the magazine at a chosen contact pressure when fitting the rail assembly into a magazine, so as to obtain an earth potential relationship or connection, each of the tongues extending through slots or recesses in the moving base wherein the tongue contact points on the at least one ail leg are only angularly bent at an uppermost part of the at least one rail leg towards the other one of the first and the second rail leg and the slots or recesses in the mounting base are oriented perpendicular to a sliding direction of the circuit board on the rail assembly.

2. A rail assembly according to claim 1, wherein the contact tongue contact points are adapted to lie against individual electrical contact surfaces formed between holes in a part of the magazine.

3. A rail assembly according to claim 1, wherein the mounting base is provided with electrically insulating projections which are adapted to extend through said bottom part to lock with a part of the magazine.

4. A rail assembly according to claim 3, wherein there are between three and eight contact tongue contact points located between successive ones of the projections.

5. A rail assembly according to claim 1, wherein the contact tongues have a width which corresponds to between 25% and 50% of a width of the bottom rail-part.

6. A rail assembly according to claim 1, wherein the contact rail is made from a metal material having a thickness of about 0.1 mm.

7. A rail assembly according to claim 1, wherein each tongue has a width of 4–10 mm.

8. A rail assembly according to claim 7, wherein a distance between adjacent tongues is from 1–4 mm.

9. A rail assembly according to claim 1, wherein each tongue has a height of 5–10 mm.

10. A rail assembly according to claim 1, adjacent tongues are separated by apertures that extend into the bottom part.

11. A rail assembly according to claim 1, wherein the second leg is substantially flat except for an uppermost part of the second leg that is angled away from the first leg.

12. A rail assembly according to claim 1, wherein the first leg is longer than the second leg and the row of tongues being provided on the first leg, the tongue contact points of the row of tongues on the first leg being located at a distance above the second leg.

13. A rail assembly according to claim 12, wherein said distance is from 1–3 mm.

14. A rail assembly according to claim 1, wherein the mounting base is provided with electrically insulating projections which are adapted to extend through said bottom part to lock with a part of the magazine.

15. A rail assembly according to claim 14, wherein there are between three and eight contact tongue contact points located between successive ones of the projections.

16. A rail assembly according to claim 4, wherein there are five contact tongue contact points located between successive ones of the projections.

17. A rail assembly according to claim 14, wherein there are five contact tongue contact points located between successive ones of the projections.

18. A rail assembly according to claim 2, wherein the contact rail is made from a metal material having a thickness of about 0.1 mm.

19. A rail assembly according to claim 6, wherein each tongue has a width of 4–10 mm.

20. A rail assembly according to claim 6, wherein each tongue has a height of 5–10 mm.

* * * * *